United States Patent
Sukekawa

(10) Patent No.: US 6,261,949 B1
(45) Date of Patent: *Jul. 17, 2001

(54) METHOD FOR MANUFACTURING SEMICONDUCTOR DEVICE

(75) Inventor: Mitsunari Sukekawa, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,704

(22) Filed: Apr. 6, 1999

(30) Foreign Application Priority Data

Apr. 7, 1998 (JP) .................................. 10-094392

(51) Int. Cl.[7] .............................................. H01L 21/4763
(52) U.S. Cl. .................... 438/637; 438/634; 438/622; 438/624; 438/638; 438/627; 438/643; 257/750; 257/751; 257/758
(58) Field of Search .................... 438/634, 627, 438/643, 637, 648, 624, 638, 618, 622, 623; 257/750, 751, 758

(56) References Cited

U.S. PATENT DOCUMENTS 5,672,543 * 9/1997 Chang et al. ........................ 438/653
5,807,761 * 9/1998 Coronel et al. ........................ 438/14
5,893,752 * 4/1999 Zhang et al. ........................ 438/687
5,920,790 * 7/1999 Wetzel et al. ........................ 438/618

FOREIGN PATENT DOCUMENTS

| 0 720 223 | 7/1996 | (IT) . |
| 9-153545 | 6/1997 | (JP) . |
| 9-306966 | 11/1997 | (JP) . |
| 10-261707 | * 9/1998 | (JP) . |
| 11-17142 | 1/1999 | (JP) . |

* cited by examiner

Primary Examiner—Charles Bowers
Assistant Examiner—Hsien-Ming Lee

(57) ABSTRACT

A contact hole is formed in the first interlayer insulation film on a semiconductor substrate. While making the contact hole remaining a cavity, the second interlayer insulation film is formed on the first interlayer insulation film. Thereafter, a resist film having a wiring groove pattern is formed on the second interlayer insulation film. Using this resist film as a mask, the second interlayer insulation film is etched. By so doing, a wiring groove is formed in the second interlayer insulation film, and the contact hole which remains a cavity is opened, thereby forming a wiring groove and a contact hole substantially simultaneously. A nitride film formed between the first interlayer insulation film and the second interlayer insulation film may, therefore, merely function as an etching stopper. Thus, it is possible to either make the nitride film thinner than the conventional nitride film or to dispense with the nitride film. Hence, it is possible to reduce the capacity of the interlayer wiring.

13 Claims, 9 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device for forming a contact hole and a wiring embedding groove in an interlayer insulation film and then forming a multilayer metal wiring.

2. Description of the Related Art

There is a limit to increasing a two-dimensional wiring region in a semiconductor device. To overcome this limit, a multilayer wiring structure which is a three-dimensional wiring structure has been provided. The multilayer wiring structure requires reducing inter-wiring capacity to thereby decrease an impedance.

A technique for embedding a wiring into an interlayer insulation film is known as one of methods for forming a multilayer wiring. Among those embedded wiring formation techniques, particularly, a so-called dual damascene process (or an interlayer wiring method) for forming a groove for embedding a contact hole and a wiring into an interlayer insulation film, then embedding a conductive material into the contact hole to form a contact and, at the same time, embedding a conductive material into the groove to form a metal wiring is disclosed by, for example, Japanese Patent Application Laid-Open No. 9-306988.

The interlayer wiring formation method includes, first, as shown in FIG. 1A, forming an interlayer insulation film (silicon oxide film) 602 on a conductive material 601, coating a photo resist 604 after growing an interlayer nitride film 603 serving as a stopper and forming a contact hole pattern on the interlayer nitride film 603 by normal photolithography and dry etching. In this case, the contact hole pattern is only formed on the interlayer nitride film 603.

Next, as shown in FIG. 1B, after removing the photo resist 604, an interlayer insulation film (silicon oxide film) 606 is grown.

As shown in FIG. 1C, after the photo resist 607 is coated on the interlayer insulation film 606, a pattern for a wiring groove is formed on the photo resist 607 by photolithography. Using this photo resist 607 as a mask, the interlayer insulation films 606 and 602 are etched under the condition that the etch selectivity of the oxide film to the nitride film is high. By so doing, the interlayer insulation film 606 is etched and a wiring groove 608 is formed. Also, the interlayer insulation film 602 is preferentially etched over the interlayer nitride film 603, so that the interlayer insulation film 602 is etched with the interlayer nitride film 603 used as an etch mask and a contact hole 605 is formed.

Next, as shown in FIG. 1D, the photo resist 607 is removed and metal films 609 and 610, which become wirings, are deposited into the contact hole 605 and the wiring groove 608 as well as on the interlayer insulation film 606. Finally, the metal films 609 and 610 are removed by CMP (Chemical Mechanical Etching) or dry etching. The metal film 610 is left within the contact hole 605 and the wiring groove 608 so that the metal film 610 is flush with the interlayer insulation film 606, thereby completing an embedded wiring consisting of the metal films 609 and 610.

According to the embedded wiring formation method using the above-stated dual damascene process, however, since the interlayer insulation film 602 is etched with the interlayer nitride film 603 used as a mask, it is necessary not to complete etching the interlayer nitride film 603 before the contact hole 605 penetrating the interlayer insulation film 602 is formed. For that reason, the interlayer nitride film 603 has to be formed thick. If the interlayer nitride film 603 is made thicker, however, the interlayer nitride film 603 covered with the interlayer insulation film 606 remains thick to disadvantageously increase inter-wiring capacity. In other words, a plasma oxide film is normally used as an interlayer insulation film. The dielectric constant of the nitride film is higher than that of the plasma oxide film. The thickness of the interlayer insulation film needs to be constant in light of the necessity of leak characteristics and the like. As a result, if the thickness of the nitride film which replace the oxide film is large, i.e., if the ratio of the nitride film to the insulating film is high, inter-wiring capacity increases due to the thick nitride film.

If the inter-wiring capacity increases, the problem of signal delay occurs, thereby disadvantageously hampering the recent demand to provide a higher-speed semiconductor device.

SUMMARY OF THE INVENTION

It is, therefore, an object of the present invention to provide a method for manufacturing a semiconductor device capable of forming an embedded wiring without increasing the capacity of an interlayer wiring.

A method for manufacturing a semiconductor device according to the present invention is characterized by comprising the steps of:

forming a first interlayer insulation film on a conductive material;

forming a contact hole in the first interlayer insulation film;

forming a second interlayer insulation film on the first interlayer insulation film while making the contact hole remain cavity;

forming a resist film for a wiring groove pattern on the second interlayer insulation film;

forming a wiring groove in the second interlayer insulation film by etching the second interlayer insulation film with the resist film used as a mask, and opening the contact hole confined by the second interlayer insulation film; and forming a wiring and a contact by embedding metal material into the wiring groove and the contact hole.

Another method for manufacturing a semiconductor device according to the present invention is characterized by comprising the steps of:

forming a first interlayer insulation film on a conductive material;

forming a first resist film on the first interlayer insulation film;

forming a contact hole pattern on the first resist film;

forming a contact hole in the first interlayer insulation film by etching the first interlayer insulation film with the first resist film used as a mask;

forming a second interlayer insulation film on the first interlayer insulation film while making the contact hole remain a cavity;

forming a second resist film on the second interlayer insulation film;

forming a wiring groove pattern on the second resist film;

forming a wiring groove in the second interlayer insulation film by etching the second interlayer insulation film with the second resist used as a mask, and opening the contact hole confined by the second interlayer insulation film; and forming a wiring and a contact by embedding metal material into the wiring groove and the contact hole.

According to the present invention, it suffices for the nitride film which has been conventionally used as a mask when etching the contact hole formed between the first interlayer insulation film and the second interlayer insulation film to only function as an etching stopper layer. Thus, the etching stopper film itself can be extremely made thinner than the nitride film used as the conventional mask. In addition, by selecting etching conditions appropriately, it is possible to dispense with the etching stopper film itself. Thus, according to the present invention, interlayer capacity can be reduced. Furthermore, according to the present invention, it is possible to form a contact hole using not the nitride film but the resist film as a mask, so that a contact hole of a desired diameter can be formed with good repeatability.

Hence, according to the present invention, it is possible to reduce inter-wiring capacity and prevent signal delay in the dual damascene process, so that the present invention is quite useful for making a semiconductor device smaller in size and higher in speed.

DESCRIPTION OF THE PREFERRED EMBODIMENTS

Figure 1A:
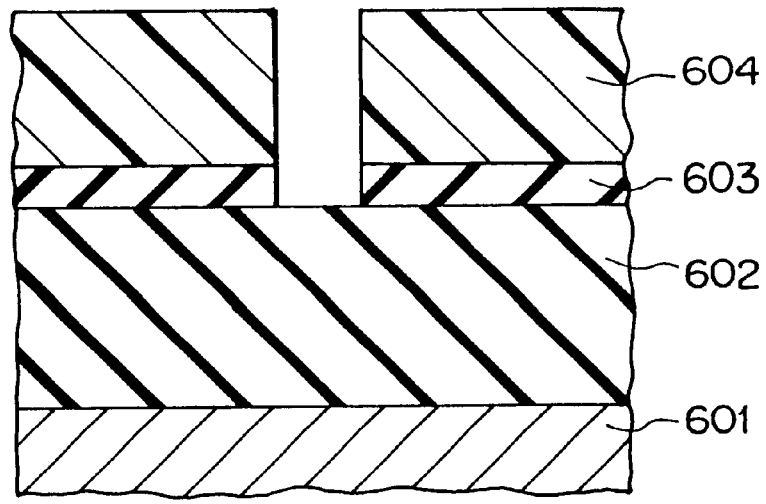
FIGS. 1A through 1D are cross-sectional views showing a conventional method for manufacturing a semiconductor device in the order of manufacturing steps.
Figure 1B:
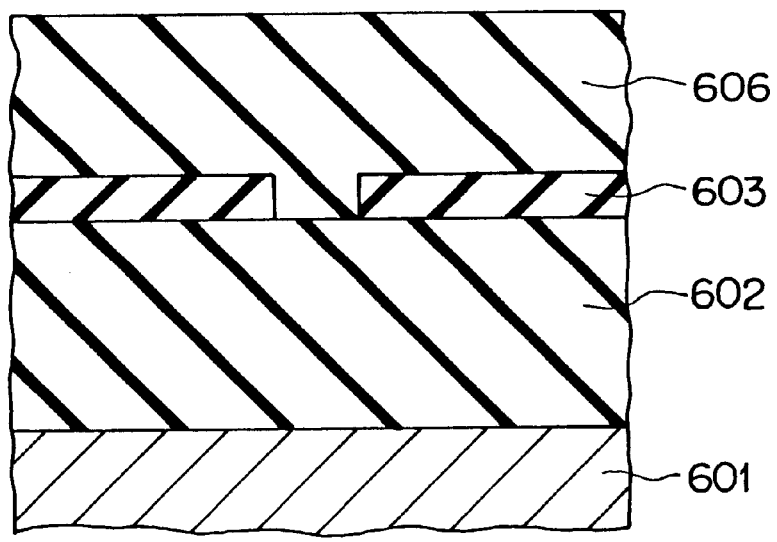
Figure 1C:
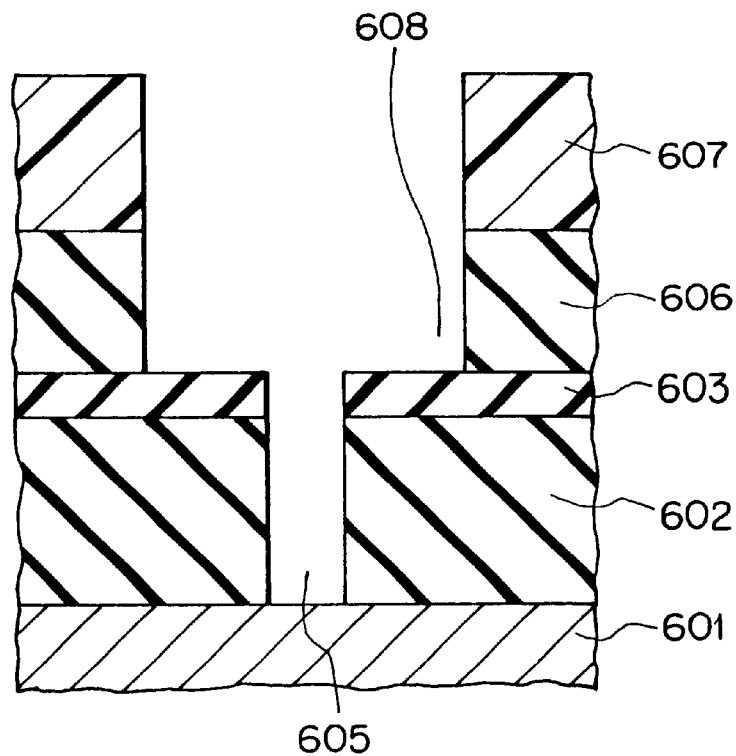
Figure 1D:
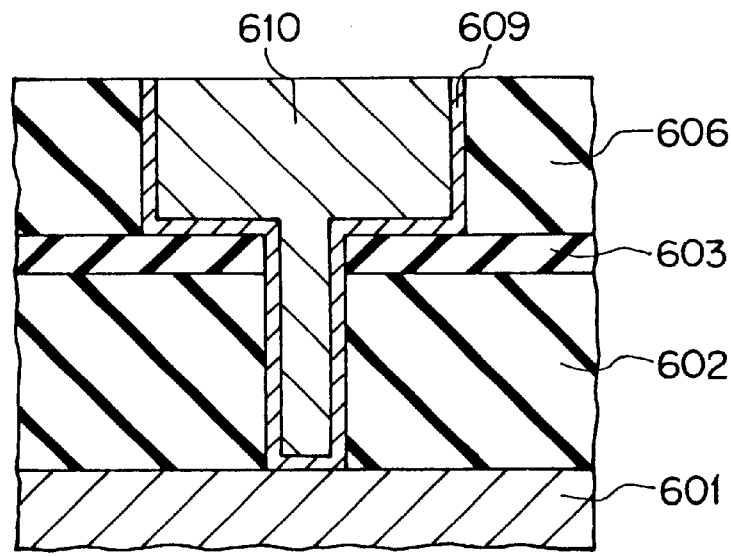
Figure 2A:
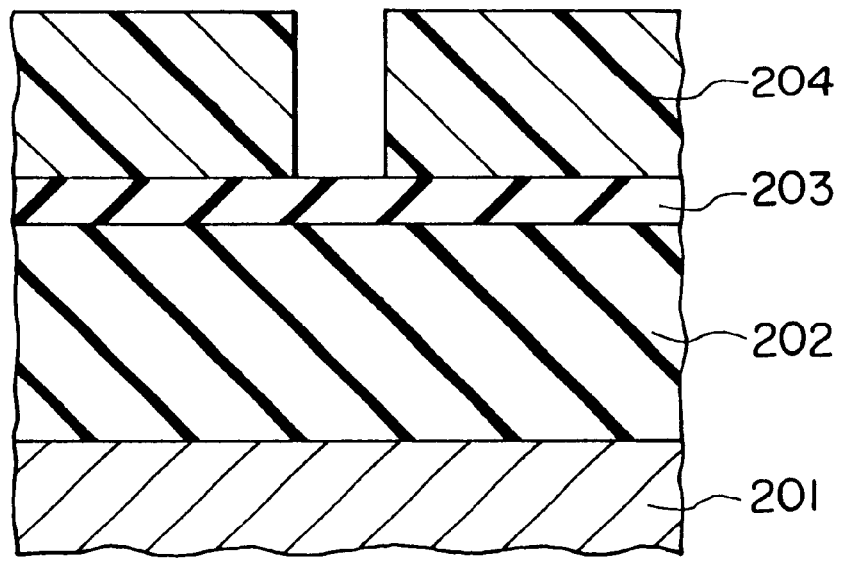
FIGS. 2A through 2H are cross-sectional views showing a method for manufacturing a semiconductor device in a first embodiment according to the present invention in the order of manufacturing steps.

Now, the preferred embodiments of the present invention will be described in detail with reference to the accompanying drawings. FIGS. 2A through 2H are cross-sectional views showing a method for manufacturing a semiconductor device in a first embodiment according to the present invention in the order of manufacturing steps. As shown in FIG. 2A, a BPSG film 202 is formed as the first interlayer insulation film on an Si substrate 201. The BPSG film 202 has a thickness of about 6000 Å. On the BPSG film 202, an SiON film 203 is formed as an etching stopper film. The SiON film 203 has a thickness of about 5000 Å. A photo resist film 204 is coated, as the first resist film, on the SiON film 203. A contact hole pattern is formed on the photo resist film 204 by photolithography.

Figure 2B:
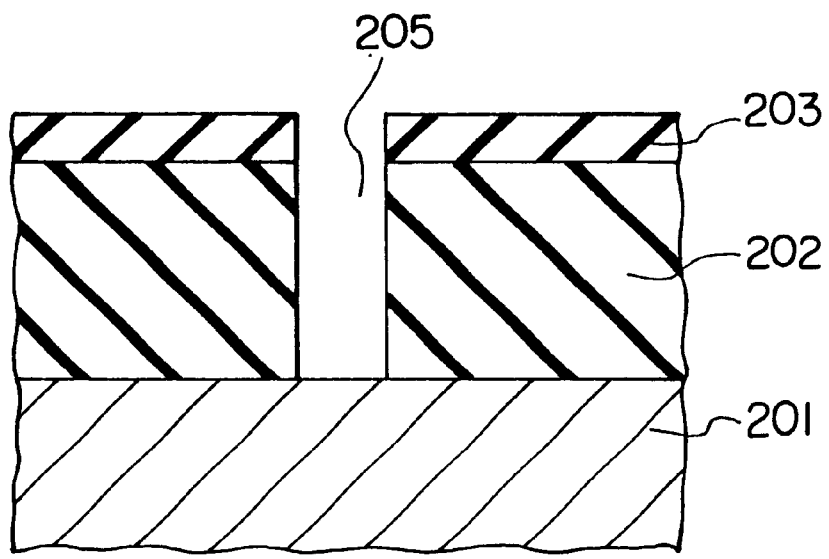

Next, as shown in FIG. 2B, using the photo resist film 204 as a mask, the SiON film 203 and the BPSG film 202 are selectively etched to thereby form a contact hole 205, within which the surface of the Si substrate 201 is exposed. Thereafter, the photo resist film 204 is removed.

Figure 2C:
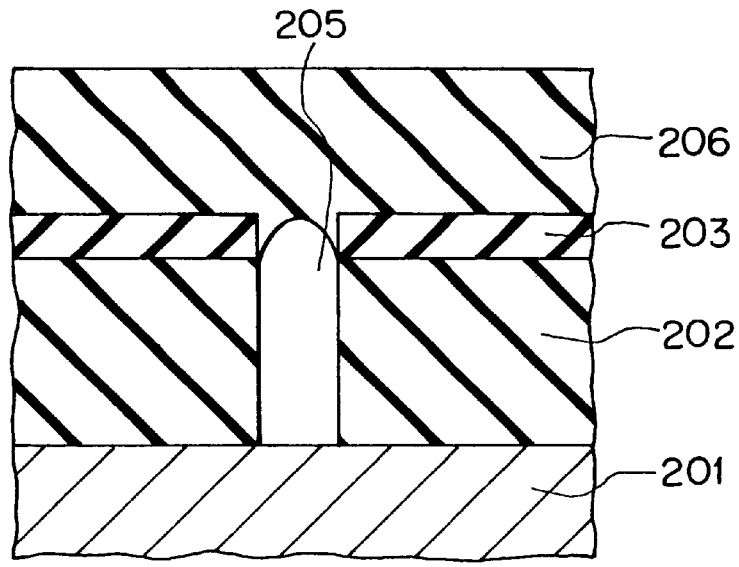

As shown in FIG. 2C, a silicon oxide film 206 having a low coverage is grown as the second insulating film at normal pressure by CVD method. The contact hole 205 is left nearly as it is, as a cavity. That is to say, the contact hole 205 is being covered with the silicon oxide film 206.

Figure 2D:
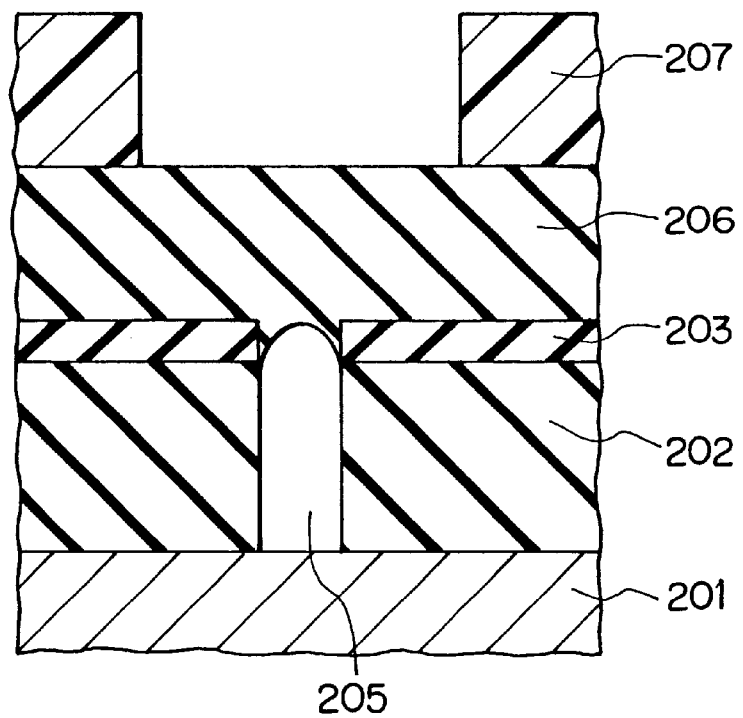

Next, as shown in FIG. 2D, the second photo resist film 207 is coated on the silicon oxide film 206 and a wiring groove pattern is formed on the second photo resist film 207 by photolithography.

Figure 2E:
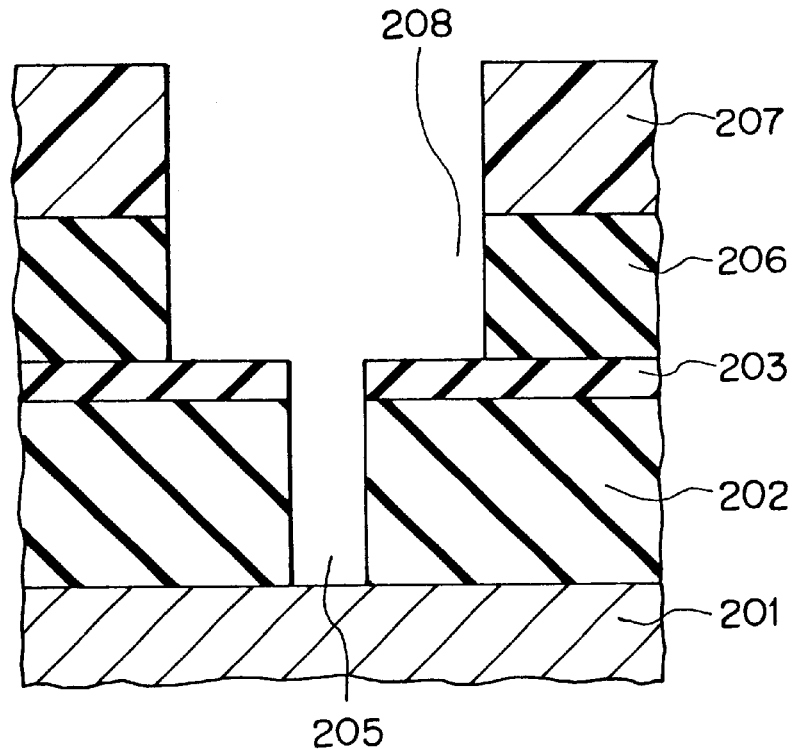
Figure 2F:
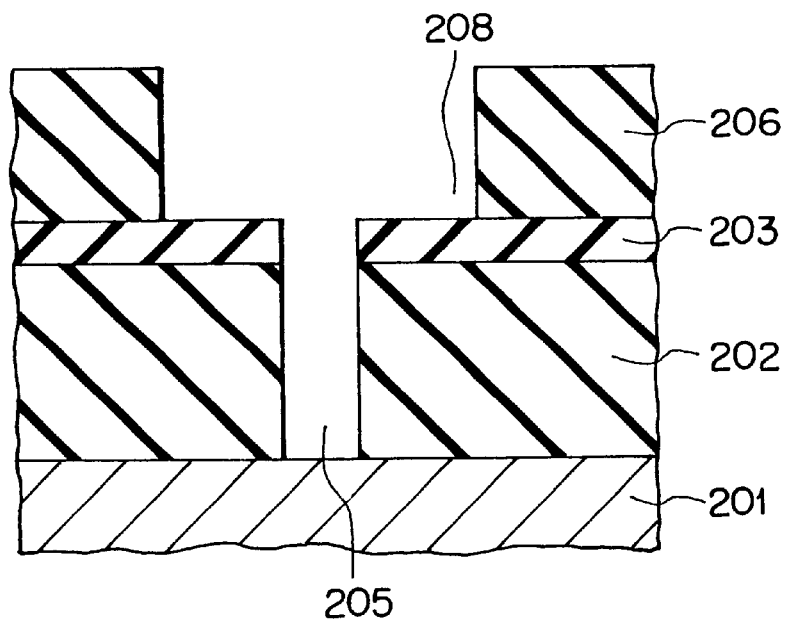

Thereafter, as shown in FIG. 2E, using the photo resist film 207 as a mask, the silicon oxide film 206 is etched, whereby a wiring groove 208 is formed in the silicon oxide film 206 and, at the same time, the cover of the silicon oxide film on the contact hole 205 is removed to open the contact hole 205. As shown in FIG. 2F, the second photo resist 207 is removed.

Figure 2G:
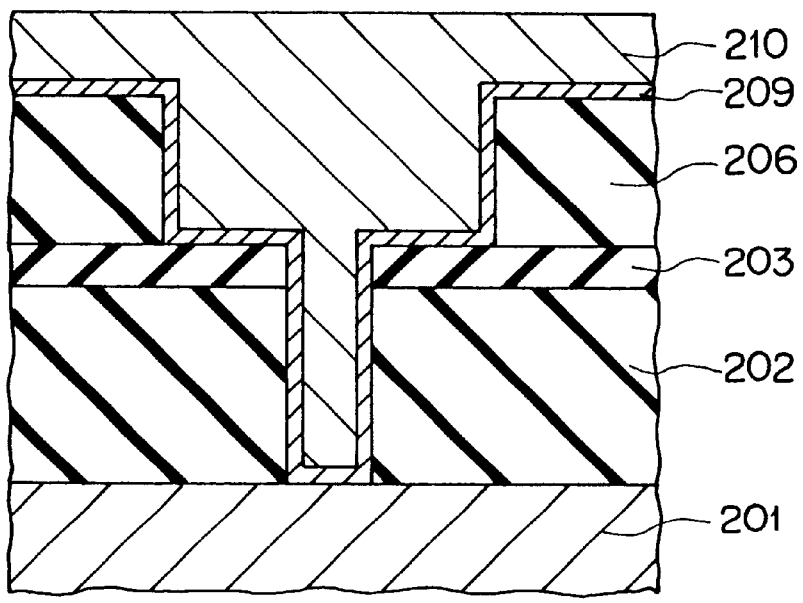

Next, as shown in FIG. 2G, a Ti/TiN film 209 consisting of a Ti film as a lower layer and a TiN film as an upper layer is formed on the inner surfaces of the contact hole 205 and the wiring groove 208. Further, a tungsten film 210 is deposited on the Ti/TiN film 209 so as to embed the contact hole 205 and the wiring groove 208. The upper layer of the Ti/TiN film 209 which contacts with the tungsten film is a TiN film and the lower layer thereof is a Ti film. Since Ti has high reactivity to tungsten, the TiN film is formed as a barrier metal between the Ti film and the tungsten film. On the other hand, the Ti film serves as a barrier metal between the TiN film and a lower wiring or a silicon substrate.

Figure 2H:
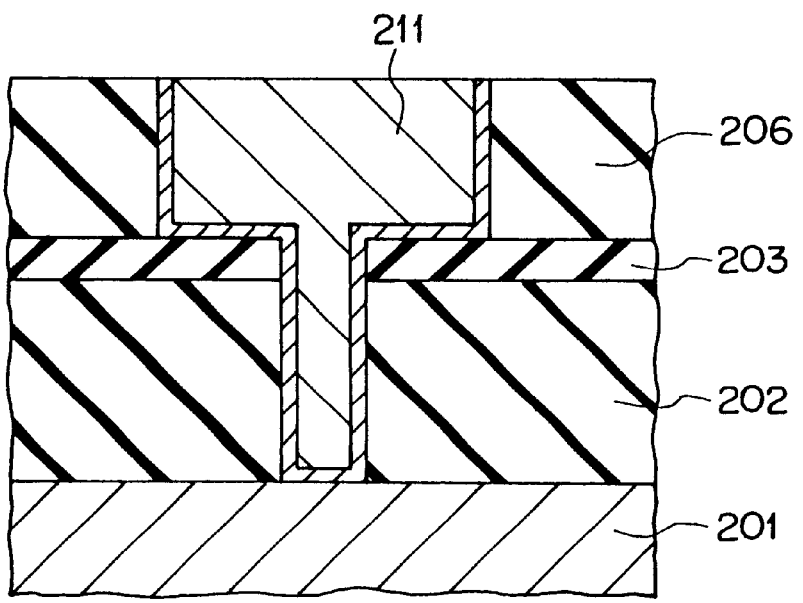

Then, as shown in FIG. 2H, the tungsten film 210 and the Ti/TiN film 209 on the silicon oxide film 206 is abraded by CMP or the like and removed so that the Ti/TiN film 209 and the tungsten film 210 are left within the contact hole 205 and the wiring groove 208. Thus, an embedded wiring 211 is completed.

According to the above-stated method in this embodiment, in the etching step of forming the wiring groove 208 shown in FIG. 2E, when the wiring groove 208 is formed by etching the silicon oxide film 206 within the opening portion of the photo resist 207, the cover on the contact hole 205, i.e., the silicon oxide film 206 is removed almost simultaneously. As a result, the contact hole 205 is formed. The conventional step of etching the BPSG film 202 as the interlayer insulation film with the SiON film 203 used as a mask to thereby form a contact hole 205 is made substantially unnecessary. In this embodiment, the SiON film 203 may merely function as an etching stopper layer. Due to this, it is not necessary to make the SiON film 203 formed thick. According to this embodiment, therefore, it is possible to reduce inter-wiring capacity.

Figure 3:
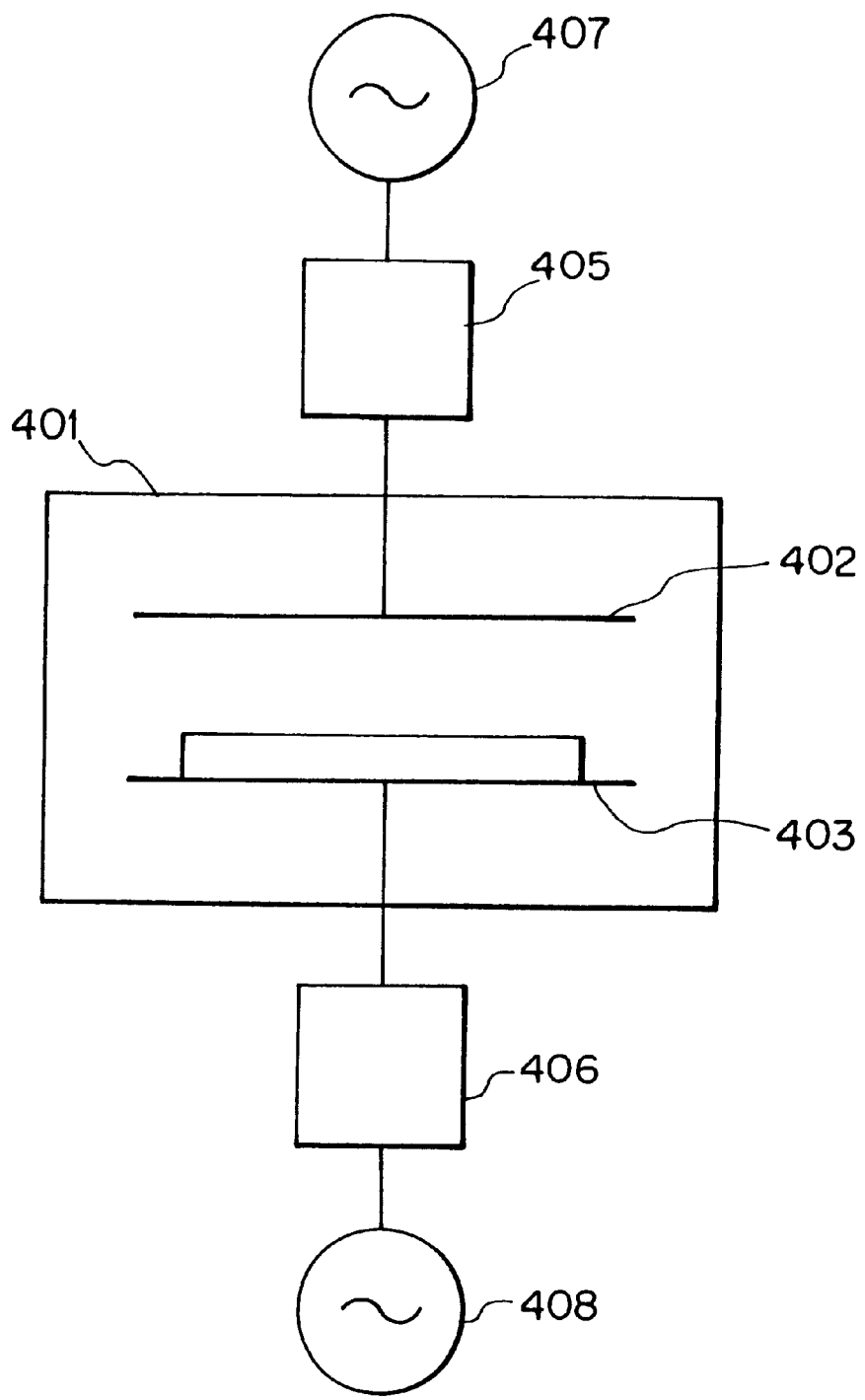
FIG. 3 is a typical view showing an etching system.

FIG. 3 shows an etching system for forming the contact hole 205. The etching system includes two opposing electrodes, i.e., an upper electrode 402 and a lower electrode 403 within a chamber 401 having a gas supply mechanism (not shown) on an upper portion thereof and a gas discharge port (not shown) on a lower portion thereof. RF power supplies 407 and 408 are connected, through matching boxes 405 and 406, to the electrodes 402 and 403, respectively.

In this system, the substrate 201 shown in FIG. 2A is inserted into the chamber 401, and the SiON film 203 and the BPSG film 202 are etched with $CHF_3$ and $C_4F_8$, Ar or $O_2$ gas, thereby exposing the Si substrate 201. The first photo resist film 204 is then removed and the contact hole 205 is formed. At this time, the RF frequencies of the upper and lower portions of the etching system preferably fall within the ranges of 27 $MH_z$ to 100 $MH_z$ and 800 $kH_z$ to 4 $MH_z$, respectively.

Next, as shown in FIG. 2C, if the silicon oxide film 206 is grown on the contact hole 205 and the SiON film 203 by a TEOS gas at a substrate temperature of 600° C. by, for example, an atmospheric thermal CVD method, the silicon oxide film is hardly deposited into the contact hole 205 and the upper portion of the contact hole 205 is covered with the silicon oxide film 206.

In this state, the second photo resist film 207 is coated on the silicon oxide film 206 and a wiring groove pattern is formed by photolithography, as shown in FIG. 2E. Next, using the second photo resist 207 as a mask, the silicon oxide film 206 is etched using the etching system shown in FIG. 3 again, thereby forming the wiring groove 208 and the contact hole 205. At this time, etching is stopped at the SiON film 203 using an etch end point detecting mechanism. An emission wavelength used in end point detection is desirably that of Co, i.e., 483 nm.

Thereafter, as shown in FIG. 2G, the TiN film 209 and the tungsten film 210 are deposited within the contact hole 205 and the wiring groove 208 as well as on the silicon oxide film 206. Finally, the TiN film 209 and the tungsten film 210 are abraded by, for example, CMP so that the TiN film 209 and the tungsten film 210 are left within the contact hole 205 and the wiring groove 208, thus completing the embedded wiring 211.

Now, a method for manufacturing a semiconductor device in a second embodiment according to the present invention will be described in the order of manufacturing steps, with reference to FIGS. 4A through 4C.

This embodiment is designed to make it possible to form a capacitive electrode by embedding a capacitive material instead of a wiring.

Figure 4A:
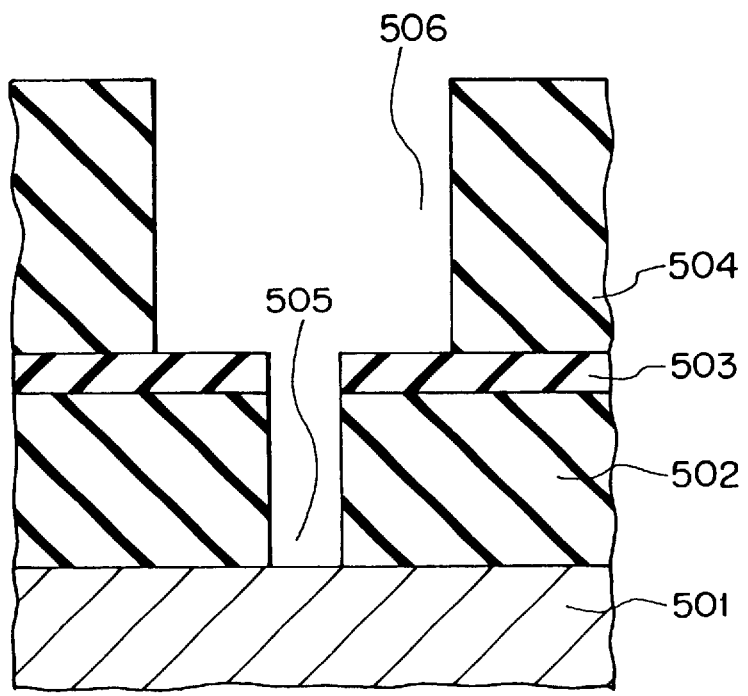
FIGS. 4A through 4C are cross-sectional views showing a method for manufacturing a semiconductor device in a second embodiment according to the present invention in the order of manufacturing steps.

As shown in FIG. 4A, a BPSG film 502 is formed on a silicon substrate 501, an SiON film 503 is formed on the BPSG film 502 and a silicon oxide film 504 is formed on the SiON film 503. Through the same steps shown in FIGS. 2A through 2F, a wiring groove 506 and a contact hole 505 are formed.

Figure 4B:
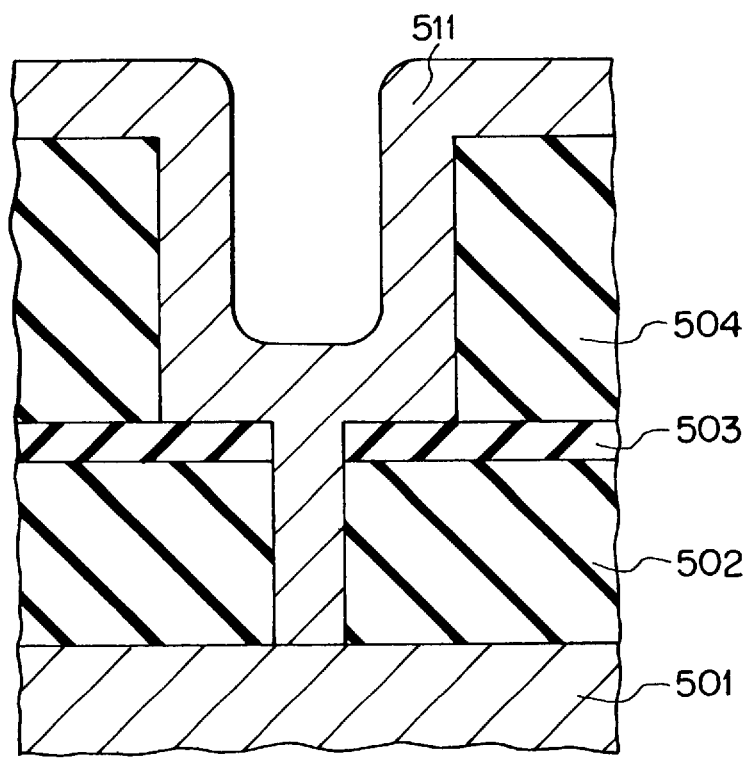

Next, as shown in FIG. 4B, an electrode material such as, for example, a polysilicon film 511 is grown.

Figure 4C:
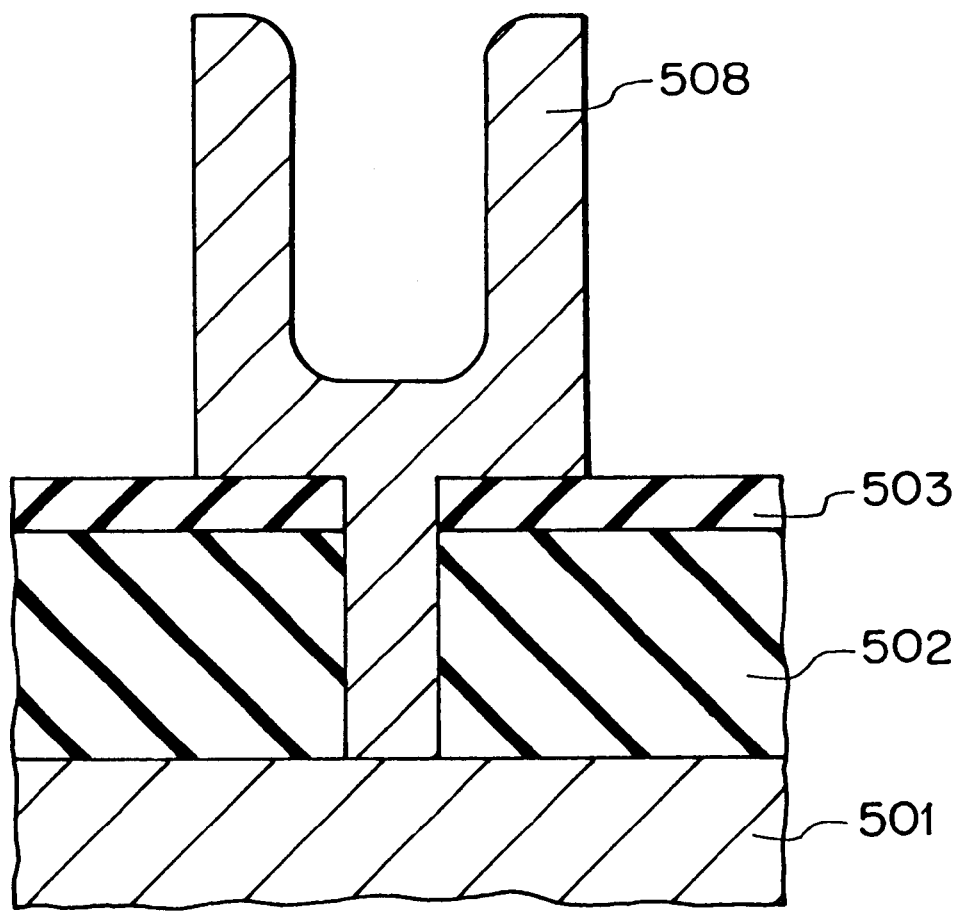

As shown in FIG. 4C, the polysilicon film 511 on the silicon oxide film 504 is removed and the silicon oxide film 504 on the SiON film 503 is then removed using CMP or the like. Thus, the formation of a tubular capacitive electrode 508 is completed.

In the second embodiment as in the case of the first embodiment shown in FIGS. 2A through 2H, the SiON film 503 may be made thin and an impedance to the capacitive electrode 508 can be, therefore, reduced.

It should be noted that an SION film is formed as an etching stopper film in both the first and second embodiments described above. It is also possible to dispense with this etching stopper itself by appropriately selecting etching conditions and the constituent material for the interlayer insulation films.

What is claimed is:
1. A method for manufacturing a semiconductor device comprising the steps of:
    forming a first interlayer insulation film on a conductive material;
    forming an etching stopper film on said first interlayer insulation film;
    forming a first photoresist film on said etching stopper film;
    forming a contact hole in said first photoresist film to expose said etching stopper film;
    then forming a contact hole in said etching stopper film and said first interlayer insulation film to expose the conductive material;
    forming a second interlayer insulation film on said first interlayer insulation film while making said contact hole remain as a cavity;
    forming a second resist film for a wiring groove pattern on said second interlayer insulation film;
    forming a wiring groove in said second interlayer insulation film by etching said second interlayer insulation film with said second resist film used as a mask and thereby opening the contact hole confined by said second interlayer insulation film; and
    forming a wiring and a contact by embedding metal material into said wiring groove and said contact hole.

2. The method according to claim 1, wherein an etching end point of said first interlayer insulation film is detected by detecting etching of said stopper film.

3. The method according to claim 1, wherein the metal material embedded into said contact hole and wiring groove is a laminated film consisting of Ti and TiN and a tungsten film.

4. The method according to claim 1, wherein said second interlayer insulation film is a silicon oxide film.

5. The method according to claim 1, wherein said first interlayer insulation film is a BPSG film.

6. A method for manufacturing a semiconductor device comprising the steps of:
    forming a first interlayer insulation film on a conductive material;
    forming a first resist film on said first interlayer insulation film;
    forming a contact hole pattern on said first resist film;
    then forming a contact hole in said first interlayer insulation film by etching said first interlayer insulation film with said first resist film used as a mask;
    forming a second interlayer insulation film on said first interlayer insulation film while making said contact hole remain a cavity;
    forming a second resist film on said second interlayer insulation film;
    forming a wiring groove pattern on said second resist film;
    forming a wiring groove in said second interlayer insulation film by etching said second interlayer insulation film with said second resist used as a mask, and opening the contact hole confined by said second interlayer insulation film; and
    forming a wiring and a contact by embedding metal material into said wiring groove and said contact hole.

7. The method according to claim 6, comprising the step of, between the step of forming said first interlayer insulation film and the step of forming said first resist film, forming a stopper film on said first interlayer insulation film.

8. The method according to claim 7, wherein said contact hole is formed by continuously etching said stopper film and said first interlayer insulation film with said first resist film used as a mask.

9. The method according to claim 8, wherein an etching end point of said first interlayer insulation film is detected by detecting etching of said stopper film.

10. The method according to claim 6, wherein the metal material embedded into said contact hole and wiring groove is a laminated film consisting of Ti and TiN and a tungsten film.

11. The method according to claim 6, wherein said second interlayer insulation film is a silicon oxide film.

12. The method according to claim 6, wherein said first interlayer insulation film is a BPSG film.

13. A method for manufacturing a semiconductor device comprising the steps of:

forming a first interlayer insulation film on a conductive material;

forming a contact hole in said first interlayer insulation film to expose said conductive material;

then, forming a second interlayer insulation film on said first interlayer insulation film while making said contact hole remain as a cavity;

forming a resist film for a wiring groove pattern on said second inlayer insulation film;

forming a wiring groove in said second interlayer insulation film by etching said second interlayer insulation film with said resist film used as a mask, and opening the contact hole confined by said second interlayer insulation film; and forming a wiring and a contact by embedding metal material into said wiring groove and said contact hole.

* * * * *